Figure 1:
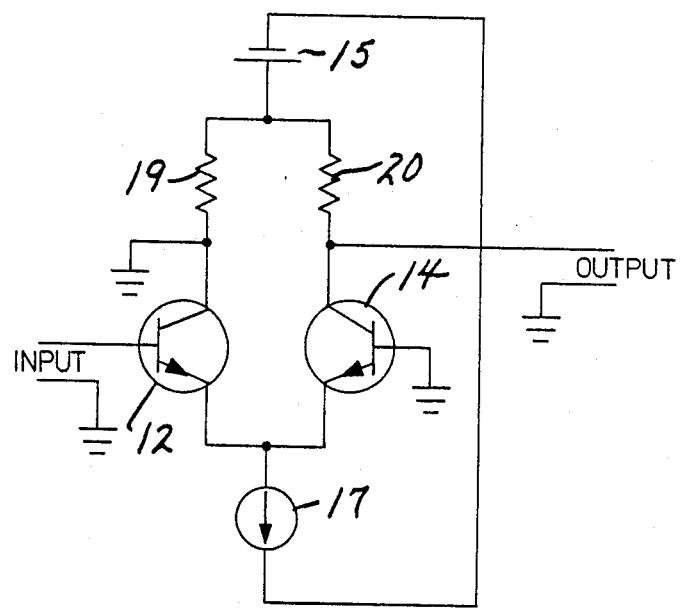

United States Patent [19]

Thiel

[11] Patent Number: 4,772,857
[45] Date of Patent: Sep. 20, 1988

[54] AMPLIFYING CIRCUIT

[76] Inventor: James E. Thiel, 4158 Georgetown Rd., Lexington, Ky. 40511

[21] Appl. No.: 15,671

[22] Filed: Feb. 17, 1987

[51] Int. Cl.$^4$ .............................................. H03F 3/45
[52] U.S. Cl. .................................... 330/261; 330/252
[58] Field of Search ................................ 330/252, 261

[56] References Cited

FOREIGN PATENT DOCUMENTS 1246821  8/1967  Fed. Rep. of Germany ...... 330/261

Primary Examiner—Gene Wan
Attorney, Agent, or Firm—Warren D. Flackbert

[57] ABSTRACT

A single stage amplifying circuit defined by a bipolar transistor differential pair, supplied from a constant current regulator, and with balanced collector load resistors. One balanced output is connected directly to signal common and, also, the circuit is powered from a supply that is isolated or floating with respect to the signal voltage common, achieving low output voltage levels of either polarity with significantly low distortion levels.

2 Claims, 1 Drawing Sheet

AMPLIFYING CIRCUIT

As is known, a need exists for a single stage signal amplifying circuit that requires no direct current blocking capacitors or feedback to satisfy very low levels of input and output direct current offset voltages and, as well, a high immunity to power supply noise. The preceding has commonly been accomplished by a one-stage differential amplifying circuit defined by a matched pair of bipolar transistors which are supplied emitter current by a shared current regulator. Typically, the base of each transistor is an input terminal of opposite polarity and the collector of each transistor is an output terminal of opposite polarity.

In such arrangement, and by connecting one transistor input base terminal to signal ground and by taking the output from the other transistor, a non-inverting amplifier results, where the output voltage is developed across the relevant load resistor. Since the collector terminal is operated at a voltage with respect to ground, a direct current blocking (or coupling) capacitor is used to allow only the alternating current signal to pass to the output terminal.

The preceding circuitry has two principal problems, to-wit, the output voltage is developed with reference to the power supply voltage and, therefore, any noise or spurious signal on the supply line will appear at the output; and, the capacitor will introduce a small amount of distortion by dielectric absorption and other mechanisms that is undesirable in some use applications.

In order to eliminate the aforesaid problems, previous arrangements utilized additional active components and/or feedback as, for example, an amplifying stage to drive a load resistor to signal common or the applying of feedback from the output to the inverting input to stabilize the direct current voltage at the output terminal to a low value.

While such circuitry eliminated at least two problems, other problems surfaced, as, for example, the circuitry, being complex, substantially increased distortion, noise level and phase shift at high frequencies; and, the application of feedback caused several types of distortion because of the time delay of the signal through the circuitry.

The amplifying circuit of the invention overcomes the preceding by presenting a bipolar transistor differential pair, supplied from a constant current regulator, and with balanced collector load resistors. Importance lies in the arrangement because one balanced output is connected directly to signal common and, also, the circuit is powered from a supply that is isolated (or "floating") with respect to the signal voltage common.

In any event, a better understanding of the invention presented herein will become more apparent from the following description, taken in conjunction with the accompanying drawing, wherein FIG. 1 is a schematic diagram of an amplifying circuit in accordance with the teachings of the present invention.

For the purposes of promoting an understanding of the principles of the invention, reference will now be made to the embodiment illustrated in the drawing and specific language will be used to describe the same. It will nevertheless be understood that no limitation of the scope of the invention is thereby intended, such alterations and further modifications in the illustrated arrangement, and such further applications of the principles of the invention as illustrated therein being contemplated as would normally occur to one skilled in the art to which the invention relates.

Referring now to FIG. 1, the instant circuitry is defined by a pair of bipolar transistors 12 and 14, powered by a direct current source 15, and maintained, at 17, at a constant or fixed current. Balanced collector load resistor 19 and 20 are each interconnected between the transistors 12 and 14, respectively, and the direct current source 15. Significantly, one of the balanced outputs is directly connected to signal common and, additionally, the powered circuit is isolated (or "floating") with respect to the signal voltage common.

As a result of the preceding, the output voltage is derived relative to signal common instead of the supply voltage and, therefore, noise on the power supply line will not be coupled to the output. Moreover, since the direct current voltage at each collector of the transistors 12 and 14 is the same, no direct current voltage is on the output, except for very small levels due to the output offset voltage of each of the transistors 12 and 14.

Since the collector-to-emitter saturation voltage of bipolar transistors 12 and 14 is, typically, 0.2 volt and the base-to-emitter bias voltage is 0.6 volt, output voltage levels of approximately 0.4 volts, of either polarity, can be obtained by reason of the instant circuit, such being with reasonably low distortion levels, and more than adequate for many applications with which the invention is used.

Again, and restated otherwise for summary, the significance of the instant single stage differential amplifying circuit is that the output and input share a common ground connection (or reference), without the necessity of employing a direct current blocking capacitor or adding circuit complexity. Additionally, another presented feature is that the output circuit is developed with reference to signal ground rather than a power supply voltage, where there are no single stage circuits included by reason of such feature. The preceding plays importance in utility, as in the instance where the amplifier serves the output of a low output phono cartridge in a stereo music system.

From the preceding, it should be apparent that the amplifying circuit defining the invention achieves performance not available heretofore without the need for additional active components and/or feedback. The specification hereabove serves to describe the invention of the following claims.

I claim:

1. A single stage amplifying circuit having a signal input and a signal output comprising a bipolar transistor differential pair, a source of a direct current, and balanced collector load resistors, where said signal input and said signal output share a common ground, and where an absence of direct current voltage difference exists between said signal input and said signal output without use of a blocking capicitor and without negative feedback from said signal output to said signal input.

2. The single stage amplifying circuit of claim 1 wherein said signal output is isolated from any power supply source.